US012464645B2

(12) United States Patent
Chen

(10) Patent No.: US 12,464,645 B2
(45) Date of Patent: Nov. 4, 2025

(54) ELECTRONIC DEVICE AND EXPANSION CARD MODULE

(71) Applicant: PEGATRON CORPORATION, Taipei (TW)

(72) Inventor: Ping-Mu Chen, Taipei (TW)

(73) Assignee: PEGATRON CORPORATION, Taipei (TW)

(*) Notice: Subject to any disclaimer, the term of this patent is extended or adjusted under 35 U.S.C. 154(b) by 180 days.

(21) Appl. No.: 18/406,276

(22) Filed: Jan. 8, 2024

(65) Prior Publication Data

US 2024/0381532 A1  Nov. 14, 2024

(51) Int. Cl.
*H05K 1/14* (2006.01)

(52) U.S. Cl.
CPC ... *H05K 1/141* (2013.01); *H05K 2201/10325* (2013.01)

(58) Field of Classification Search
CPC ...................................................... H05K 1/141
USPC ........................................................ 361/760
See application file for complete search history.

(56) References Cited

U.S. PATENT DOCUMENTS

| | | | |
|---|---|---|---|
| 7,656,089 B2* | 2/2010 | Mo | H05K 1/0269 361/748 |
| 2020/0229306 A1* | 7/2020 | Dey | H01R 12/721 |
| 2023/0273653 A1 | 8/2023 | Tsai et al. | |

FOREIGN PATENT DOCUMENTS

| | | |
|---|---|---|
| CN | 108736191 A | 11/2018 |
| CN | 208588981 U | 3/2019 |
| JP | 3222670 U | 8/2019 |
| TW | 200931225 A | 7/2009 |
| TW | I633831 B | 8/2018 |
| TW | M591642 U | 3/2020 |
| TW | M591754 U | 3/2020 |
| TW | M617810 U | 10/2021 |
| TW | 214795916 U | 11/2021 |
| WO | WO 2004062328 A1 | 7/2004 |

* cited by examiner

*Primary Examiner* — Andargie M Aychillhum
(74) *Attorney, Agent, or Firm* — Li & Cai Intellectual Property (USA) Office

(57) ABSTRACT

An expansion card module includes a carrier, an expansion card disposed on the carrier, a heat-dissipation member disposed on the expansion card, and a latch assembly that is assembled to the carrier. The carrier includes a first end and a second end that is opposite to the first end. The second end has a pivotal portion. The expansion card has an electrical connection end that is arranged adjacent to the first end of the carrier. The expansion card is disposed between the carrier and the heat-dissipation member. The latch assembly is pivotally connected to the pivotal portion of the carrier.

10 Claims, 12 Drawing Sheets

ELECTRONIC DEVICE AND EXPANSION CARD MODULE

CROSS-REFERENCE TO RELATED PATENT APPLICATION

This application claims the benefit of priority to Taiwan Patent Application No. 112117641, filed on May 12, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an expansion card, and more particularly to an electronic device and an expansion card module.

BACKGROUND OF THE DISCLOSURE

A conventional expansion card is fixed onto a circuit board by inserting one end of the conventional expansion card into a connector of the circuit board and fixing another end of the conventional expansion card onto the circuit board through a screw. However, this manner of assembly of the conventional expansion card is inflexible, and is not conducive to further fix a heat-sink onto the expansion card.

SUMMARY OF THE DISCLOSURE

In response to the above-referenced technical inadequacies, the present disclosure provides an electronic device and an expansion card module for effectively improving on the issues associated with conventional expansion cards.

In order to solve the above-mentioned problems, one of the technical aspects adopted by the present disclosure is to provide an electronic device, which includes a circuit board, a connector assembled onto and electrically coupled to the circuit board, a fixing seat fixed to the circuit board and spaced apart from the connector, and an expansion card module that is detachably assembled to the circuit board. The expansion card includes an expansion card assembly and a latch assembly. The expansion card assembly includes a carrier, an expansion card, and a heat-dissipation member. The carrier includes a first end and a second end that is opposite to the first end. The second end has a pivotal portion. The expansion card is disposed on the carrier. The expansion card has an electrical connection end that is arranged adjacent to the first end of the carrier. The electrical connection of the expansion card is configured to insert into the connector. The heat-dissipation member is disposed on the expansion card. The expansion card is disposed between the carrier and the heat-dissipation member. The latch assembly is pivotally connected to the pivotal portion of the carrier. When the expansion card module is connected to the connector through the electrical connection end, the expansion card module is configured to allow the second end of the carrier to be disposed on the fixing seat for enabling the latch assembly to engage with the fixing seat and the circuit board.

In order to solve the above-mentioned problems, another one of the technical aspects adopted by the present disclosure is to provide an expansion card module, which includes an expansion card assembly and a latch assembly. The expansion card assembly includes a carrier, an expansion card, and a heat-dissipation member. The carrier includes a first end and a second end that is opposite to the first end. The second end has a pivotal portion. The expansion card is disposed on the carrier. The expansion card has an electrical connection end that is arranged adjacent to the first end of the carrier. The heat-dissipation member is disposed on the expansion card. The expansion card is disposed between the carrier and the heat-dissipation member. The latch assembly is pivotally connected to the pivotal portion of the carrier.

Therefore, the expansion card module in the present disclosure is provided to enable the expansion card to be firmly assembled with the heat-dissipation member through the structural cooperation of the components thereof, and the expansion card assembly can be quickly assembled to the circuit board by structural engagement through the latch assembly, thereby effectively increasing the flexibility of assembly (and disassembly) of the expansion card module.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1A:
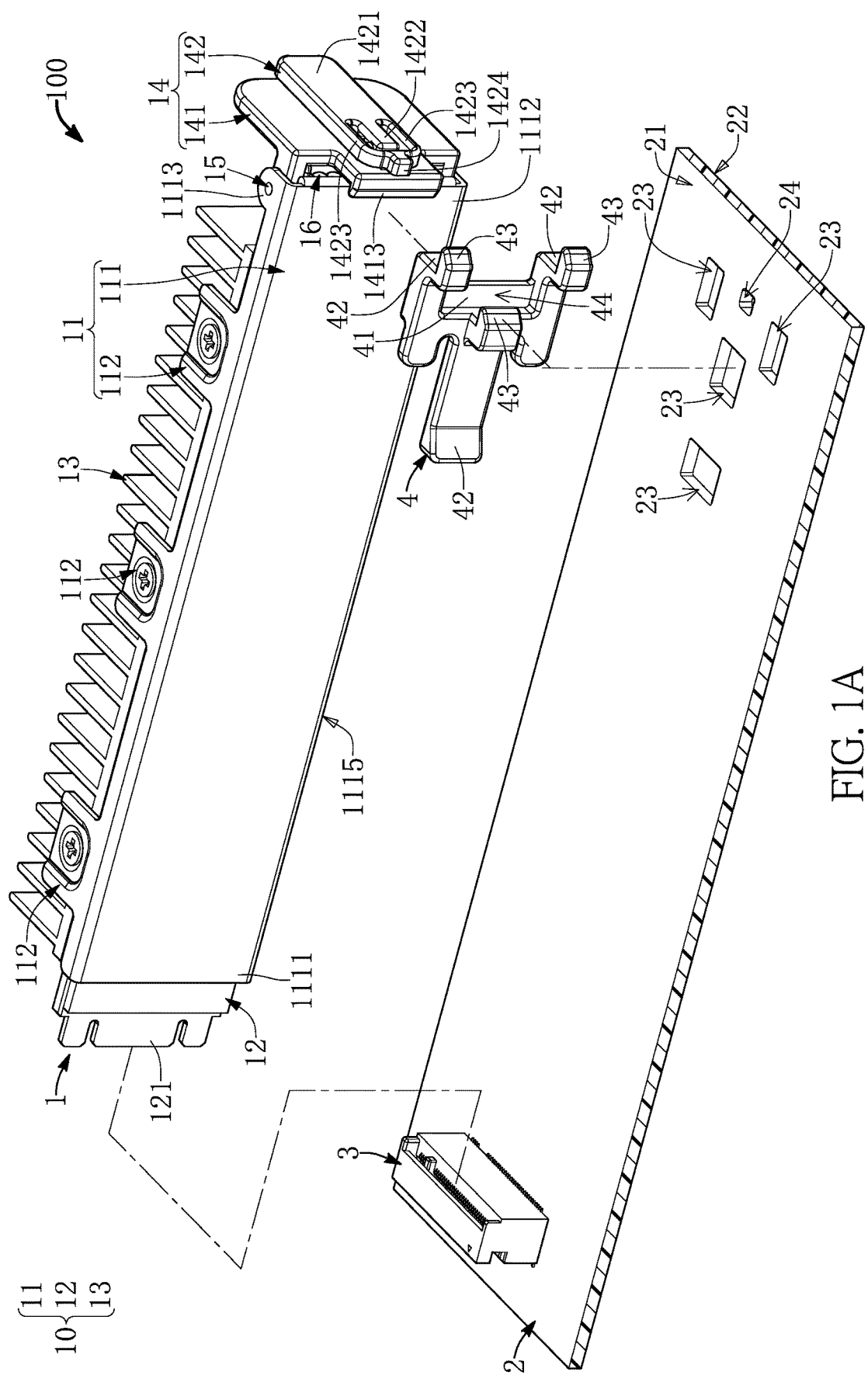
FIG. 1A is a schematic exploded view of an electronic device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1A to FIG. 8, a first embodiment of the present disclosure is provided. As shown in FIG. 1A to FIG. 3, the present embodiment provides an electronic device 100, which includes a circuit board 2, a connector 3 assembled onto and electrically coupled to the circuit board 2, a fixing seat 4 fixed onto the circuit board 2, and an expansion card module 1 that is detachably assembled to the above components.

It should be noted that the expansion card module 1 in the present embodiment is described in cooperation with (or is detachably assembled to) the circuit board 2, the connector 3, and the fixing seat 4, but the present disclosure is not limited thereto. For example, in other embodiments of the present disclosure not shown in the drawings, the expansion card module 1 can be independently used (e.g., sold) or can be used in cooperation with other components.

As shown in FIG. 1A, FIG. 1B, FIG. 1C, FIG. 4, and FIG. 5, the circuit board 2 is flat and has an upper surface 21, a lower surface 22 that is opposite to the upper surface 21, a plurality of perforations 23, and a thru-hole 24. Each of the perforations 23 and the thru-hole 24 penetrates through the upper surface 21 and the lower surface 22, and the perforations 23 and the thru-hole 24 are spaced apart from each other. Specifically, a quantity of the perforations 23 in the present embodiment is four, and three of the four perforations 23 are arranged adjacent to the thru-hole 24 and surround at an outer side of the thru-hole 24, but the present disclosure is not limited thereto.

Moreover, the connector 3 and the fixing seat 4 are disposed on the upper surface 21 of the circuit board 2, and are spaced apart from each other. In the present embodiment, the connector 3 is soldered and fixed onto the upper surface 21 of the circuit board 2, and the fixing seat 4 is engaged with the perforations 23 of the circuit board 2. The soldering manner between the connector 3 and the circuit board 2 in the present embodiment is a surface-mount technology (SMT) manner, but the present disclosure is not limited thereto.

Specifically, the fixing seat 4 includes a main body 41 and a plurality of arms 42 that are connected to the main body 41. At least one of the arms 42 has a hook part 43 arranged in an end thereof. The fixing seat 4 abuts against the upper surface 21 through the main body 41, and the hook parts 43 of the arms 42 respectively pass through the perforations 23 so as to hook onto the lower surface 22 of the circuit board 2, thereby enabling the fixing seat 4 to be firmly disposed (or assembled) on the circuit board 2.

In the present embodiment, a quantity of the arms 42 is equal to the quantity of the perforations 23, the arms 42 respectively correspond in position to the perforations 23, three of the arms 42 adjacent to the thru-hole 24 each have one of the hook parts 43, and the fixing seat 4 is configured to hook onto the lower surface 22 of the circuit board 2 through the hook parts 43, but the present disclosure is not limited thereto. In addition, the fixing seat 4 has a concave portion 44 arranged adjacent to the thru-hole 24. In the present embodiment, the concave portion 4 is recessed in the main body 41 and is in cooperation with the upper surface 21 of the circuit board 2 for providing an engagement of the expansion card module 1 (e.g., a latch assembly 14).

Figure 3:
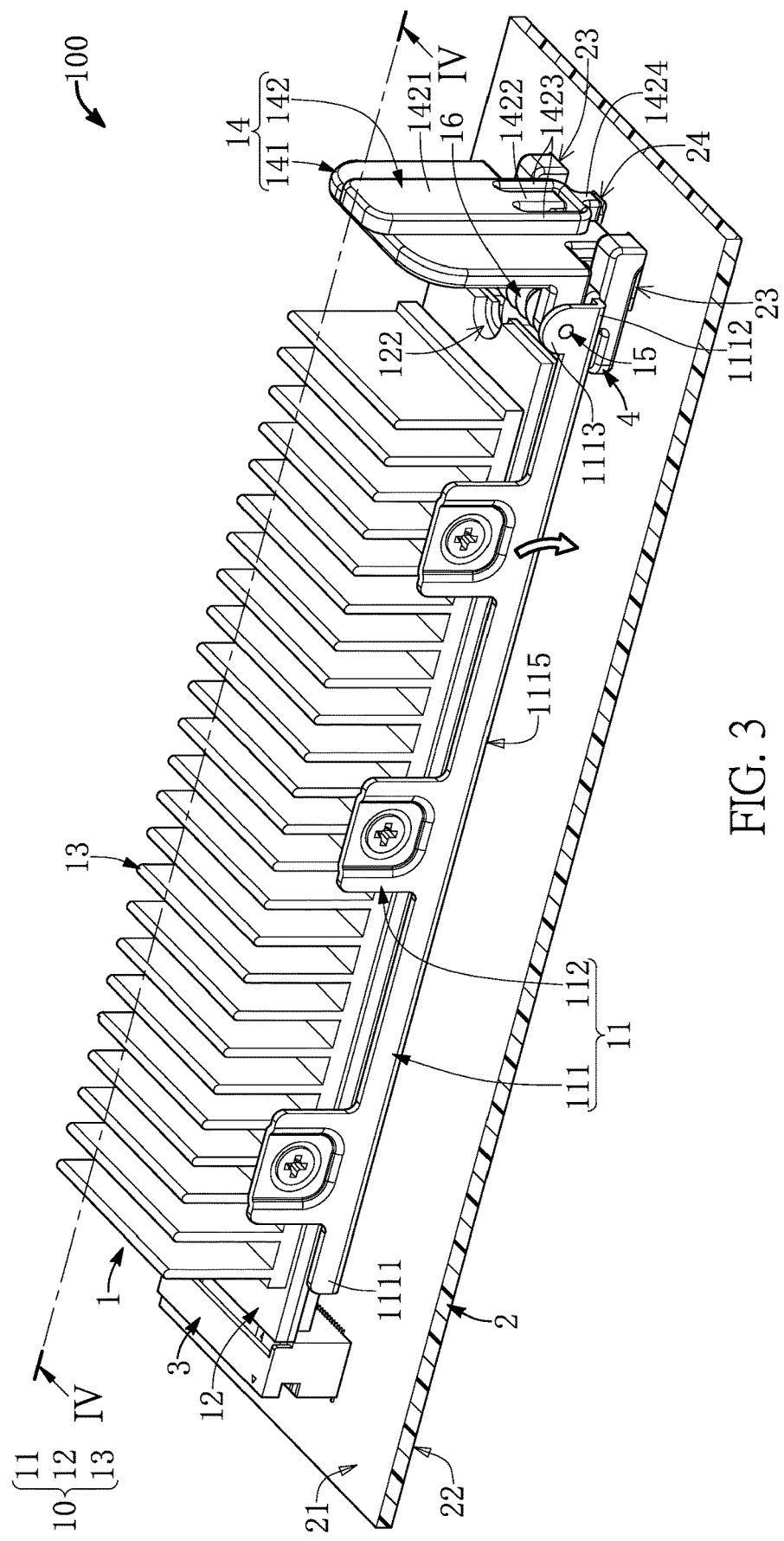
FIG. 3 is a schematic perspective view showing a second assembling step of the electronic device of FIG. 2.
Figure 4:
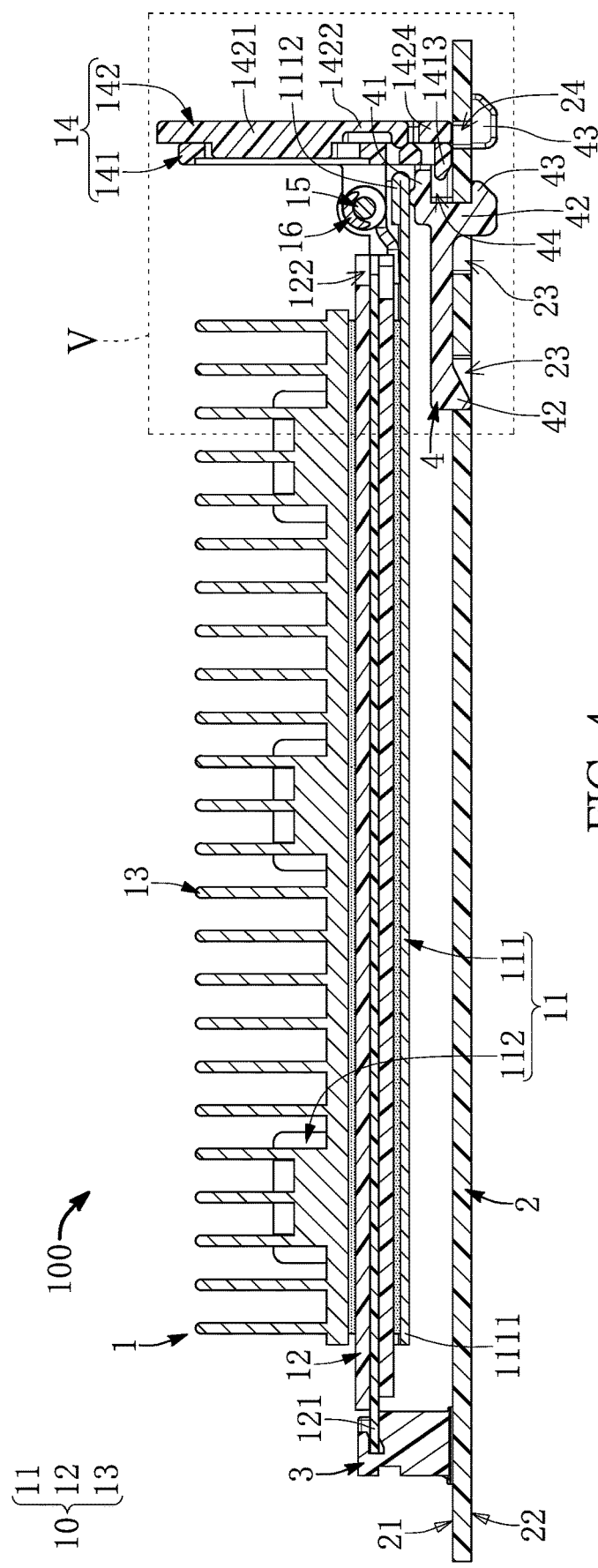
FIG. 4 is a schematic cross-sectional view taken along line IV-IV of FIG. 3.
Figure 5:
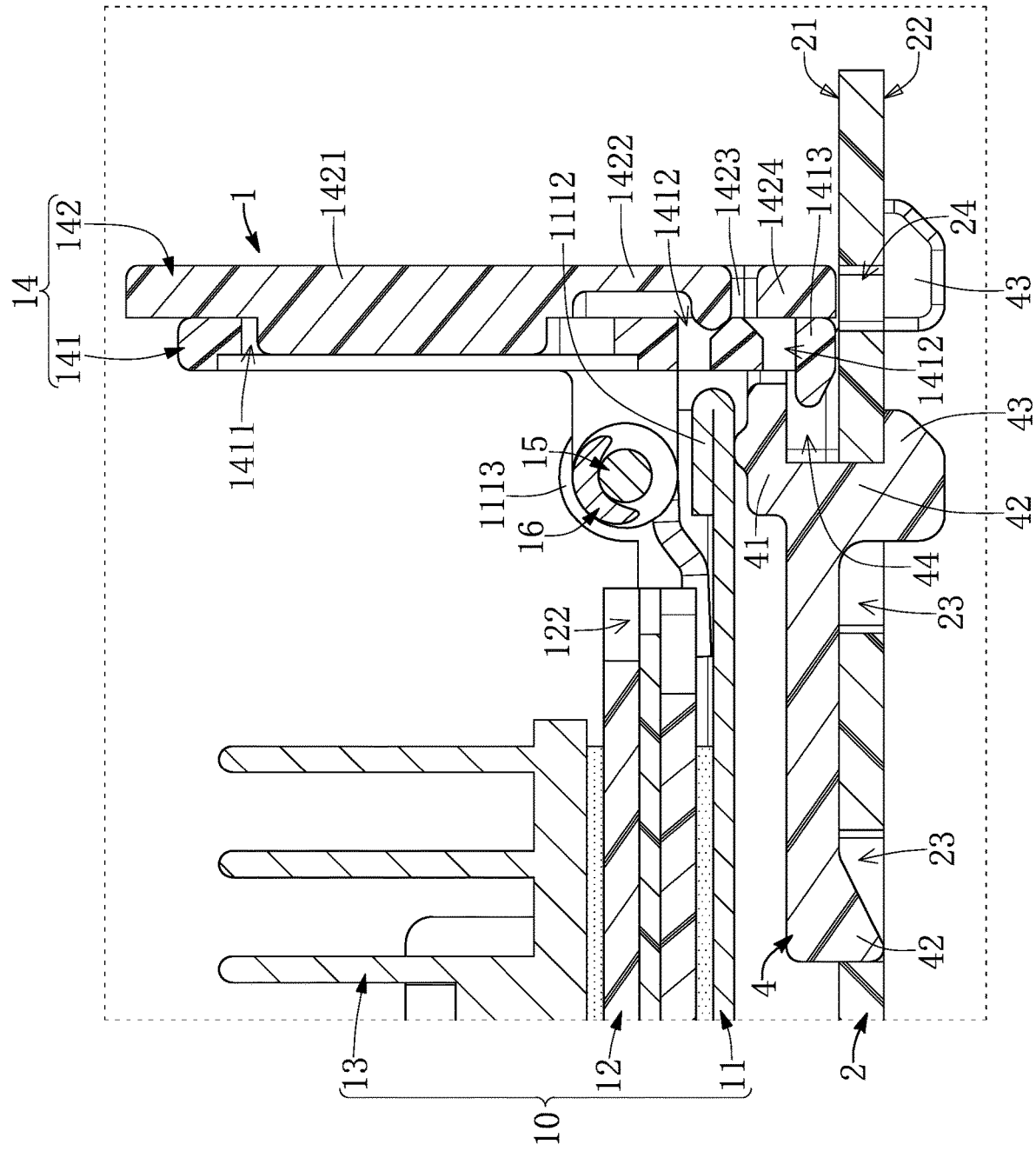
FIG. 5 is a schematic enlarged view of part V of FIG. 4.

As shown in FIG. 3 to FIG. 5, the expansion card module 1 includes an expansion card assembly 10 and a latch assembly 14 that is pivotally connected to the expansion card assembly 10. The expansion card assembly 10 includes a carrier 11, an expansion card 12 disposed on the carrier 11, and a heat-dissipation member 13 that is disposed on the expansion card 12. In other words, the expansion card 12 is disposed (or sandwiched) between the carrier 11 and the heat-dissipation member 13. The latch assembly 14 is assembled to the carrier 11 of the expansion card assembly 10. In the present embodiment, the expansion card assembly 10 is formed by the cooperation of the expansion card 12 and the other components (e.g., the carrier 11 and the heat-dissipation member 13), so that the expansion card 12 can be assembled through structural engagement by using the expansion card assembly 10 to be cooperated with the latch assembly 14 without changing its structure, thereby dispensing with the need for the conventional assembling manner using the screw.

Specifically, the carrier 11 in the present embodiment includes a supporting body 111 being plated and a plurality of lateral sheets 112 that are connected to the supporting body 111. The supporting body 111 has a first end 1111, a second end 1112 that is opposite to the first end 1111, and two long lateral edges 1115 that are connected to the first end 1111 and the second end 1112. The lateral sheets 112 are (perpendicularly) connected to the two long lateral edges 1115 of the supporting body 111. Moreover, the heat-dissipation member 13 is fixed (e.g., threaded) to the carrier 11 through the lateral sheets 112, so that the expansion card 12 is sandwiched and fixed between the supporting body 111 and the heat-dissipation member 13.

The expansion card 12 is disposed on the supporting body 111, and the expansion card 12 has an electrical connection end 121 protruded from the first end 1111 is arranged adjacent to the first end 1111. The electrical connection end 121 can be detachably inserted into and electrically coupled to the connector 3. In addition, the expansion card 12 further has a notch 122 arranged away from the electrical connection end 121, and the notch 122 is located above the supporting body 111 and is arranged adjacent to the second end 1112.

Figure 1B:
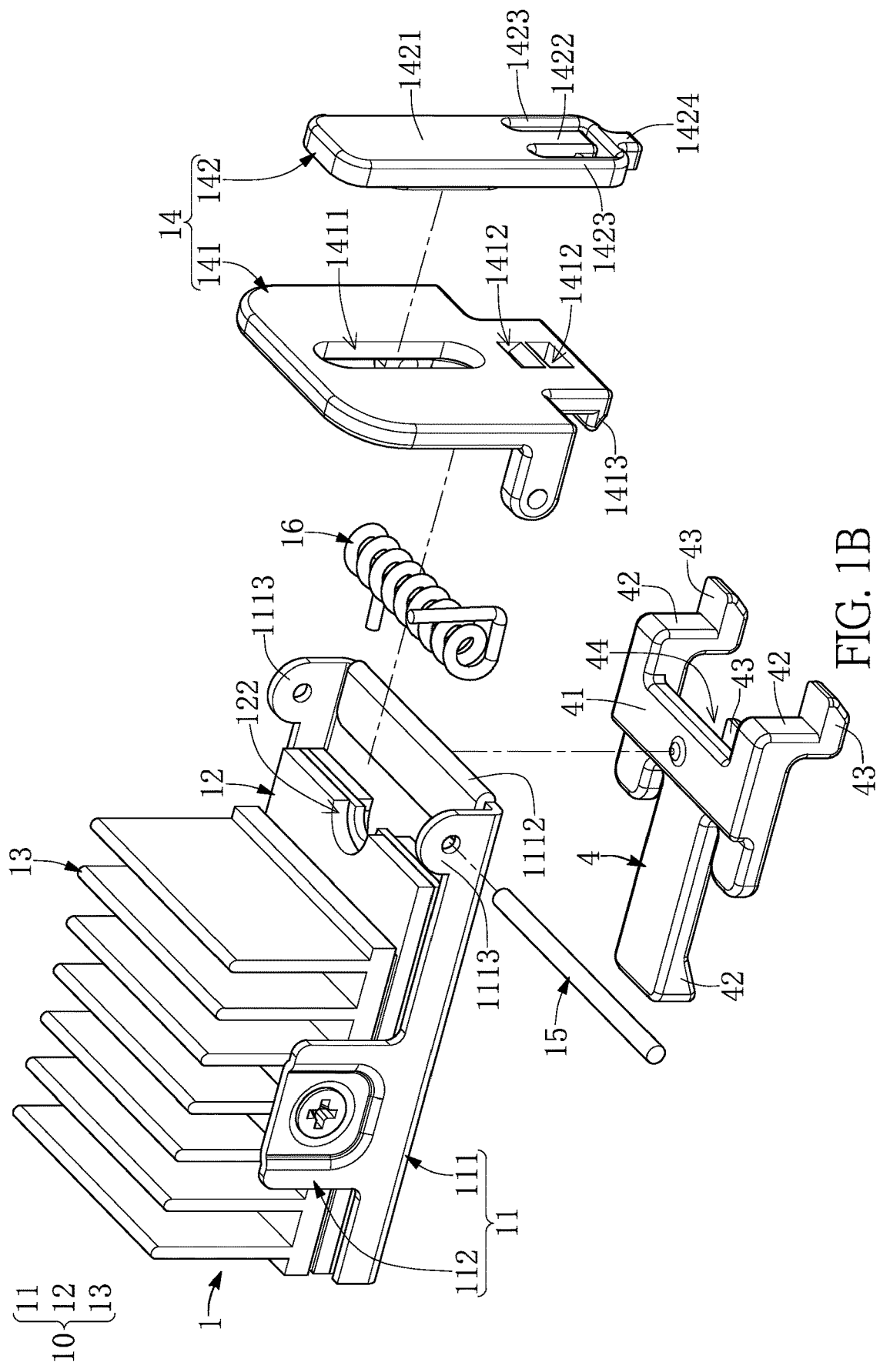
FIG. 1B is a schematic exploded view showing an expansion card module and a fixing seat of FIG. 1A.
Figure 1C:
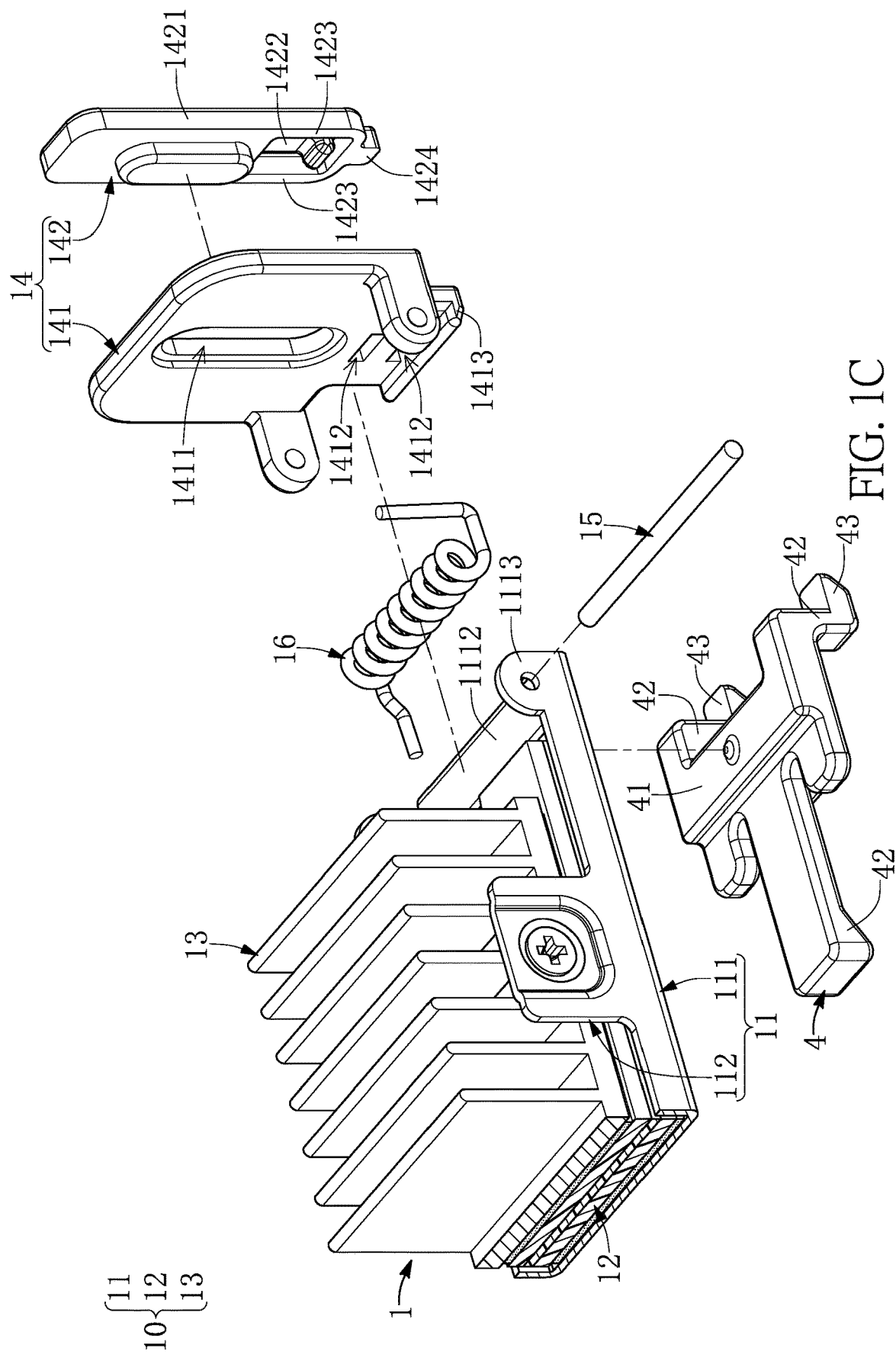
FIG. 1C is a schematic exploded view showing the expansion card module and the fixing seat of FIG. 1A from another angle of view.
Figure 2:
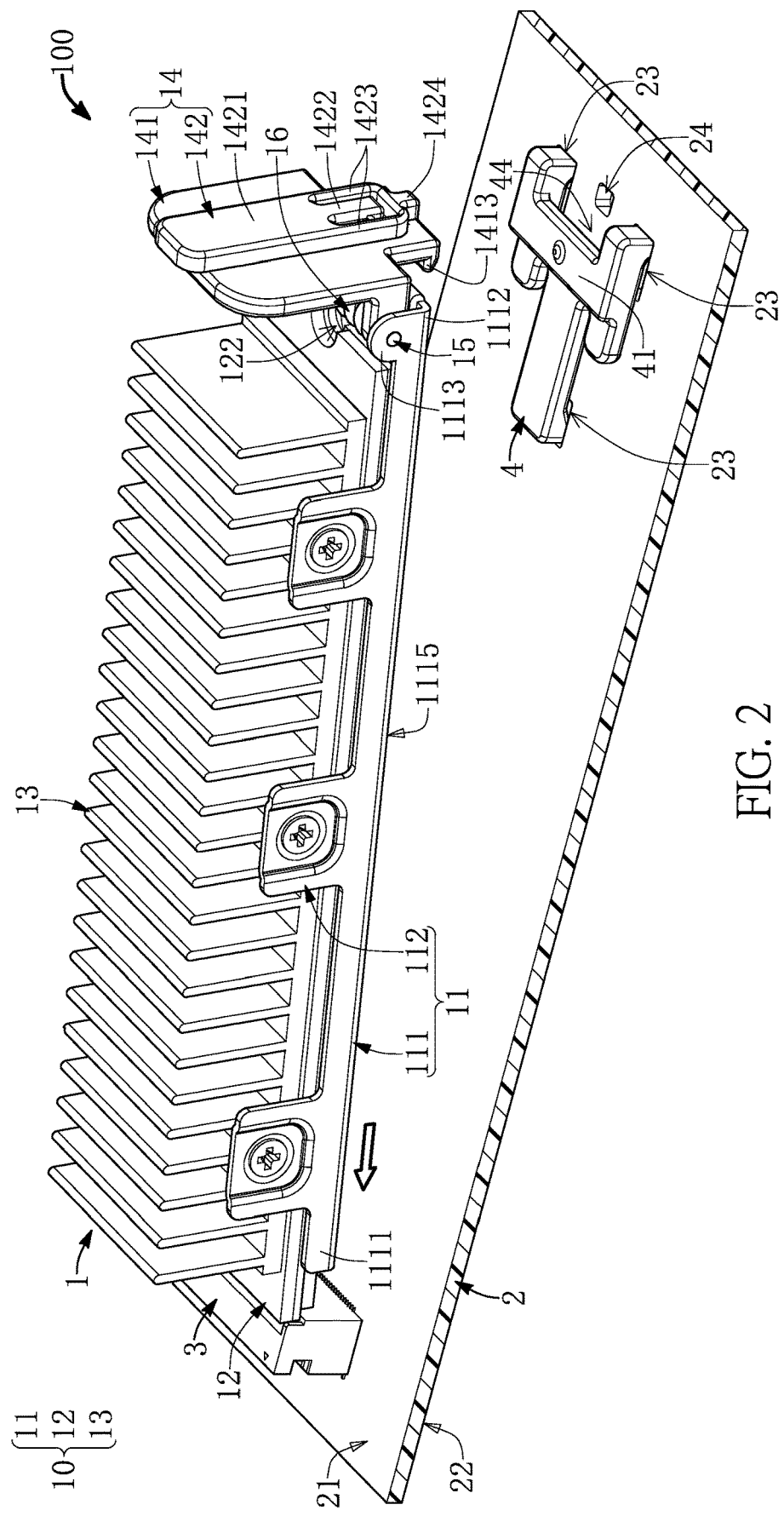
FIG. 2 is a schematic perspective view showing a first assembling step of the electronic device of FIG. 1A.

The latch assembly 14 is pivotally connected to a pivotal portion 1113 of the second end 1112. As shown in FIG. 1B and FIG. 1C, the expansion card module 1 in the present embodiment includes a pivotal shaft 15 assembled to the pivotal portion 1113 and an elastic member 16 (e.g., a spring) that is disposed on the pivotal shaft 15, so that the latch assembly 14 can be (pivotally) connected to the pivotal portion 1113 through the pivotal shaft 15 and the elastic member 16, but the present disclosure is not limited thereto. For example, in other embodiments of the present disclosure not shown in the drawings, the pivotal shaft 15 and the elastic member 16 can be omitted or can be replaced by other components according to design requirements.

Figure 6:
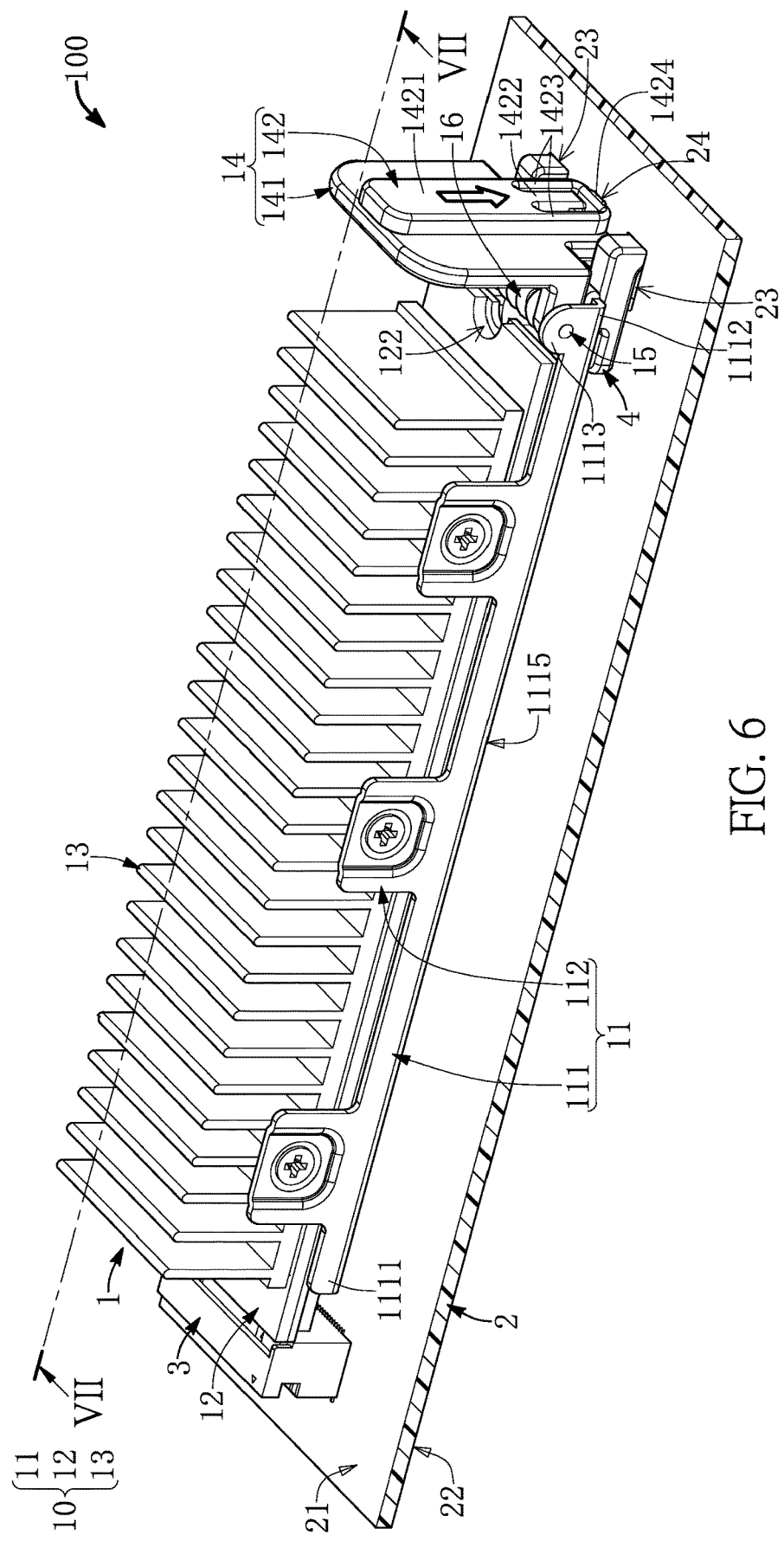
FIG. 6 is a schematic perspective view showing a third assembling step of the electronic device of FIG. 3.
Figure 7:
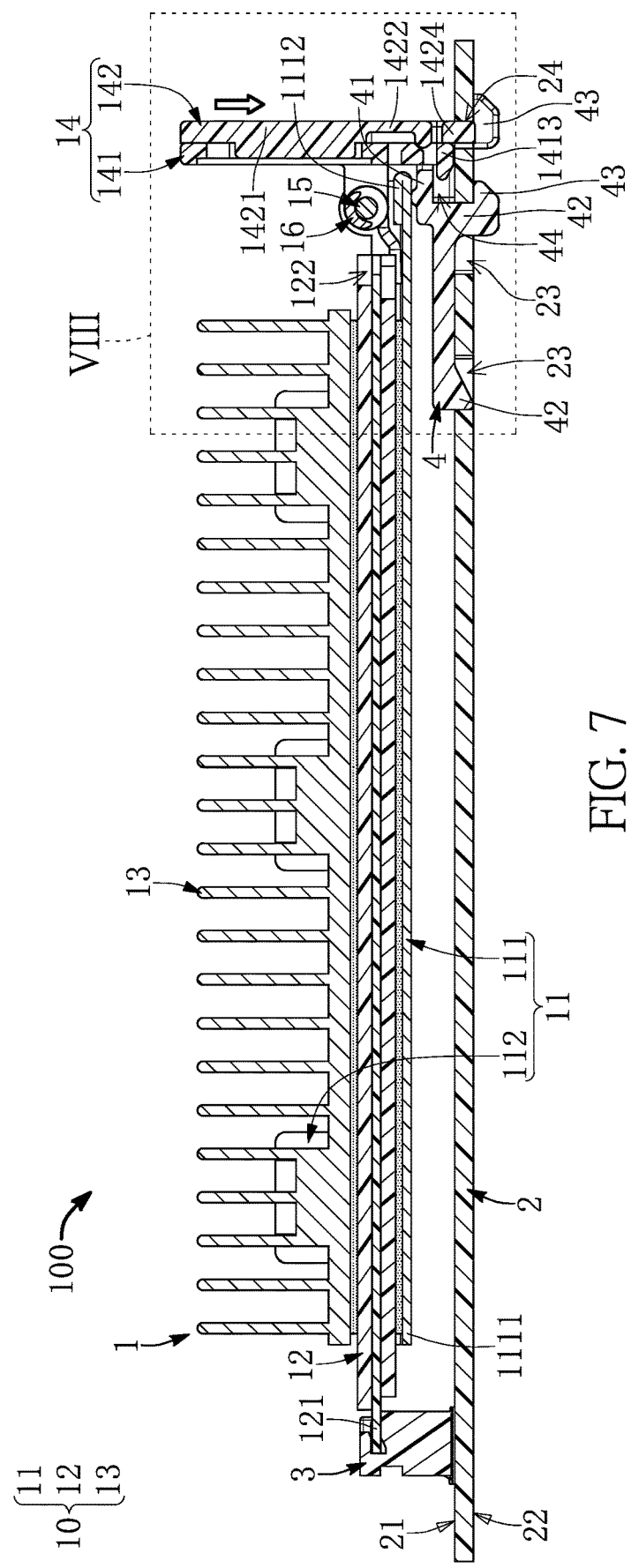
FIG. 7 is a schematic cross-sectional view taken along line VII-VII of FIG. 6.

In summary, as shown in FIG. 3, FIG. 6, and FIG. 7, when the expansion card module 1 is connected to the connector 3 through the electrical connection end 121 (inserted into the connector 3), the expansion card module 1 is configured to allow the second end 1112 of the carrier 11 to be disposed on the fixing seat 4 for enabling the latch assembly 14 to engage with the fixing seat 4 and the circuit board 2. In addition, an elastic force generated from the elastic member 16 tends to drive the latch assembly 14 to engage with the fixing seat 4, thereby further increasing the stability of the engagement between the latch assembly 14 and the fixing seat 4.

Accordingly, the expansion card module 1 in the present embodiment is provided to enable the expansion card 12 to be firmly assembled with the heat-dissipation member 14 through the structural cooperation of the components thereof, and the expansion card assembly 10 can be quickly assembled to the circuit board 2 by structural arrangement through the latch assembly 14, thereby effectively increasing the flexibility of assembly (and disassembly) of the expansion card module 1.

It should be noted that the structures of the latch assembly 14, the fixing seat 4, and the circuit board 2 can be adjusted or changed according to different design requirements, and the following description of the present embodiment only describes an exemplary structure of each of the latch assembly 14, the fixing seat 4, and the circuit board 2, but the present disclosure is not limited thereto.

Figure 8:
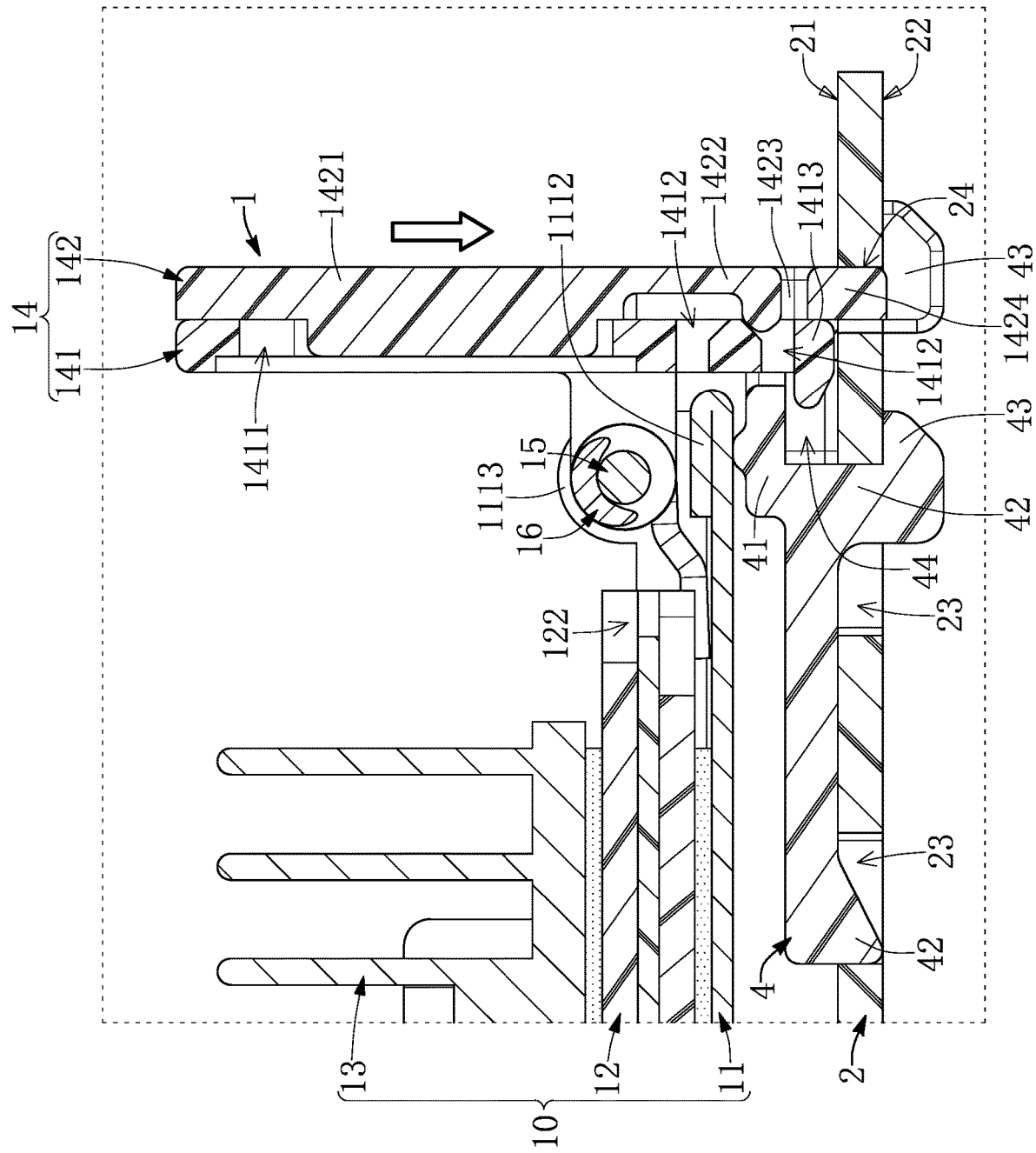
FIG. 8 is a schematic enlarged view of part VIII of FIG. 7.

As shown in FIG. 5 and FIG. 8, the latch assembly 14 in the present embodiment is integrally formed as a single one-piece structure and includes a hook member 141 and a latch member 142 that is slidably disposed on the hook member 141. The latch member 142 is slidable relative to the hook member 141 between a first position (shown in FIG. 3 to FIG. 5) and a second position (shown in FIG. 6 to FIG. 8). As shown in FIG. 1B and FIG. 1C, the hook member 141 is pivotally connected to the pivotal portion 1113, and the hook member 141 has a sliding groove 1411, two holes 1412 arranged adjacent to the sliding groove 1411, and a hook portion 1413. The sliding groove 1411, the two holes 1412, and the hook portion 1413 are arranged along a longitudinal direction of the hook member 141.

Moreover, as shown in FIG. 1B and FIG. 1C, the latch member 142 in the present embodiment is integrally formed as a single one-piece structure and includes a main segment 1421, an elastic arm 1422 connected to the main segment 1421, an extension arm 1423 connected to the main segment 1421 and surrounding the elastic arm 1422, and a latch block 1424 that is connected to the extension arm 1423. The latch member 142 is assembled to the sliding groove 1411 (through the main segment 1421) and is slidable along the hook member 141 between the first position (shown in FIG. 3 to FIG. 5) and the second position (shown in FIG. 6 to FIG. 8).

In summary, the latch assembly 14 is engaged with the fixing seat 4 (e.g., the concave portion 44) through the hook member 141 (e.g., the hook portion 1413), and the latch assembly 14 is latched to (or inserted into) the circuit board 2 by moving the latch member 142 to the second position (i.e., moving the latch member 142 into the thru-hole 24 of the circuit board 2). Specifically, when the latch member 142 is moved from the first position to the second position, the elastic arm 1422 engaged with one of the two holes 1412 (shown in FIG. 5) is moved to engage with another one of the two holes 1412 (shown in FIG. 8), and the latch block 1424 is inserted into the thru-hole 24.

Accordingly, the hook member 141 and the latch member 142 of the expansion card module 1 in the present embodiment are provided to be respectively engaged with the fixing seat 4 and the circuit board 2 along different directions, so that the expansion card module 1 can be firmly assembled to the circuit board 2 and can effectively avoid being accidentally unlocked due to an unintentional touch of the latch assembly 14.

Second Embodiment

Figure 9:
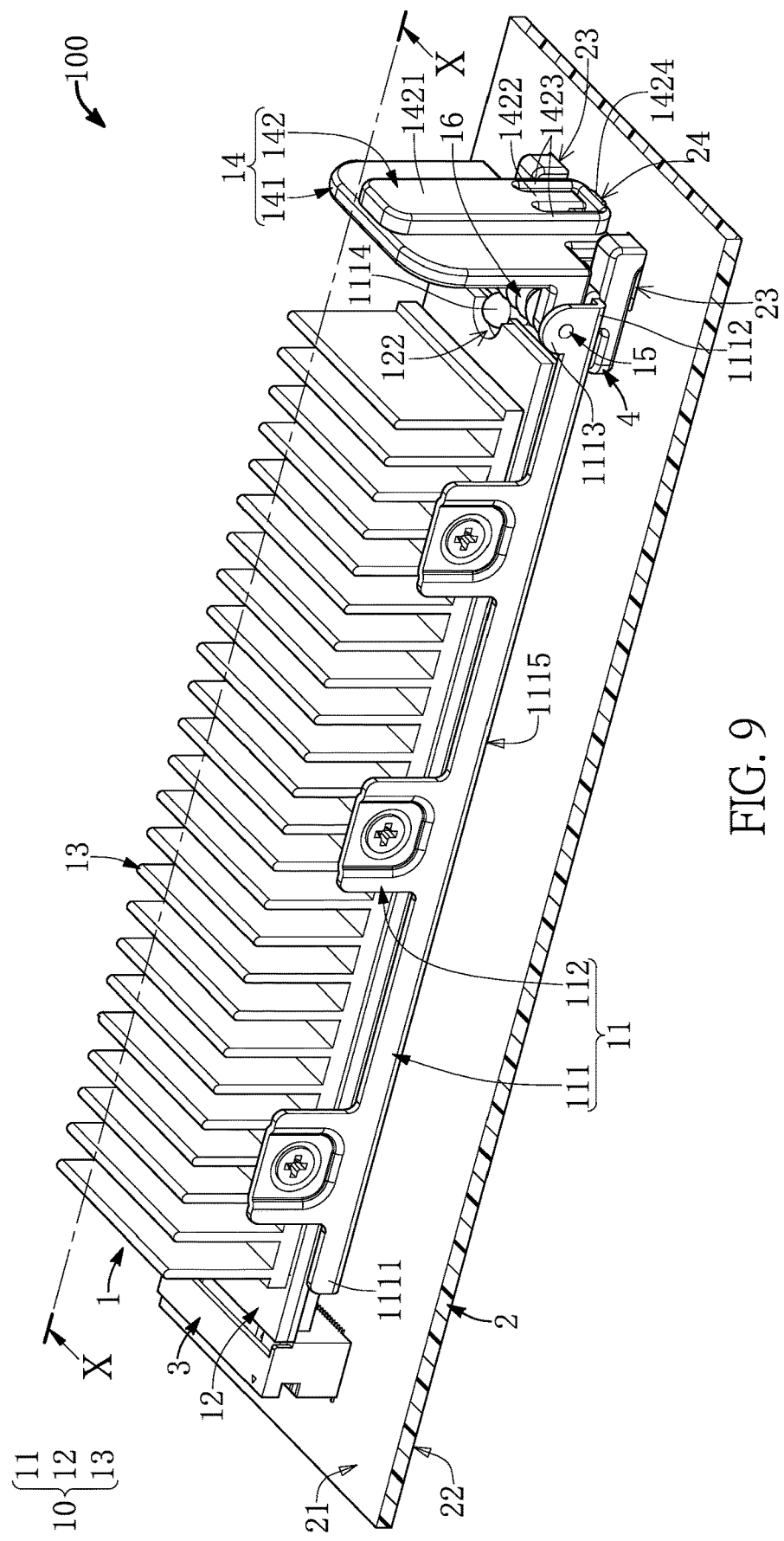
FIG. 9 is a schematic perspective view of the electronic device according to a second embodiment of the present disclosure.
Figure 10:
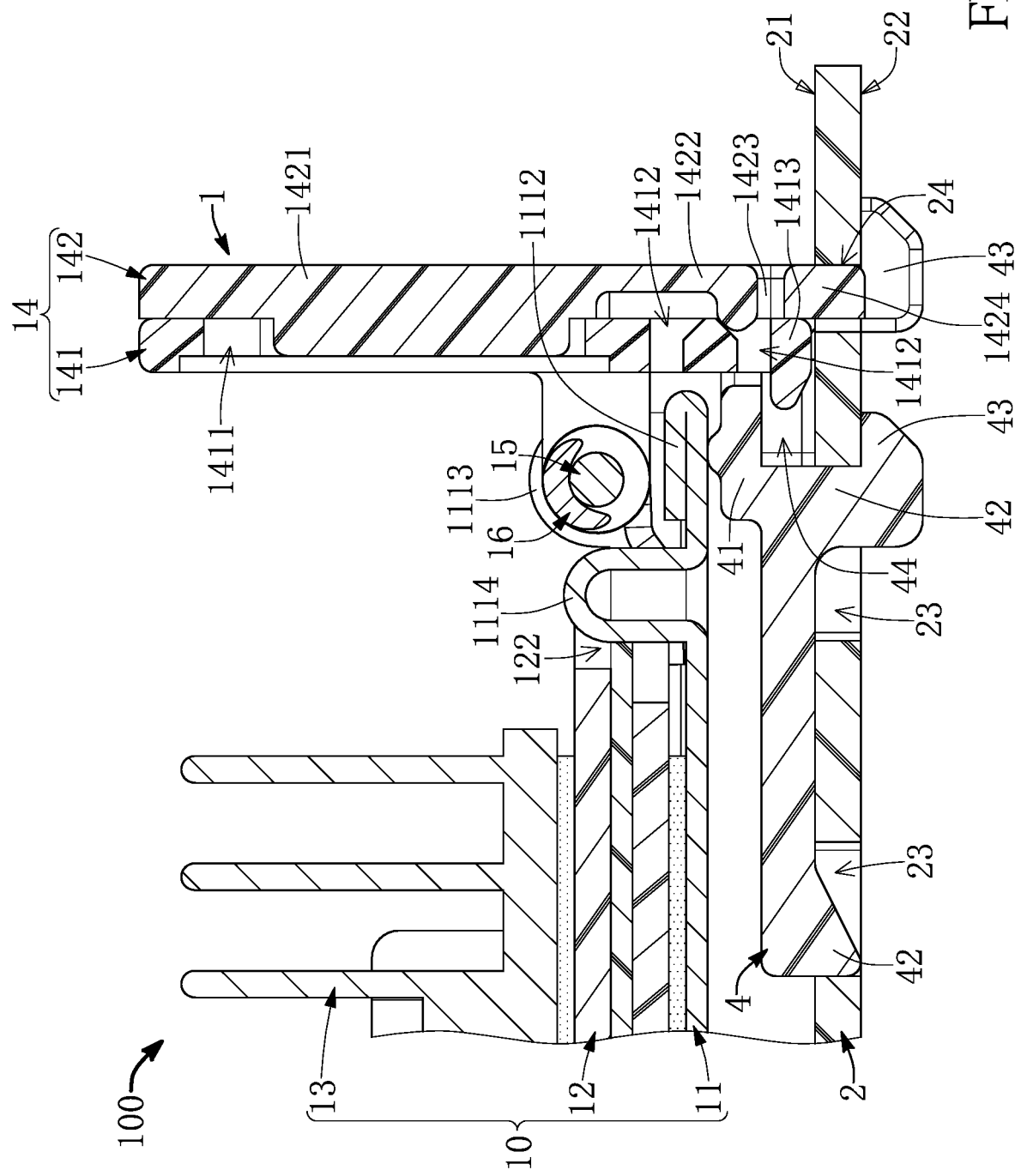
FIG. 10 is a schematic cross-sectional view taken along line X-X of FIG. 9.

Referring to FIG. 9 and FIG. 10, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the carrier 11 has a limiting element 1114 located in the notch 122. The limiting element 1114 can be a hollow protrusion formed by punching a bottom side of the supporting body 111. In other words, the limiting element 1114 is formed on the supporting body 111 and is arranged adjacent to the second end 1112, and the limiting element 1114 can be a protrusion formed by punching the supporting body 111, but the present disclosure is not limited thereto. Accordingly, the expansion card 12 can be firmly sandwiched between the carrier 11 and the heat-dissipation member 13 through the cooperation between the notch 122 and the limiting element 1114.

Beneficial Effects of the Embodiments

In conclusion, the expansion card module in the present disclosure is provided to enable the expansion card to be firmly assembled with the heat-dissipation member through the structural cooperation of the components thereof, and the expansion card assembly can be quickly assembled to the circuit board by structural arrangement through the latch assembly, thereby effectively increasing the flexibility of assembly (and disassembly) of the expansion card module.

Specifically, the hook member and the latch member of the expansion card module in the present disclosure are provided to be respectively engaged with the fixing seat and the circuit board along different directions, so that the expansion card module can be firmly assembled to the circuit board and can effectively avoid being accidentally unlocked due to an unintentional touch of the latch assembly.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device, comprising:
   a circuit board;
   a connector assembled onto and electrically coupled to the circuit board;
   a fixing seat fixed to the circuit board and spaced apart from the connector; and
   an expansion card module detachably assembled to the circuit board and including:
      an expansion card assembly including:
         a carrier including a first end and a second end that is opposite to the first end, the second end having a pivotal portion;
         an expansion card disposed on the carrier and having an electrical connection end arranged adjacent to the first end of the carrier, the electrical connection of the expansion card being configured to insert into the connector; and
         a heat-dissipation member disposed on the expansion card,
         wherein the expansion card is disposed between the carrier and the heat-dissipation member; and
      a latch assembly pivotally connected to the pivotal portion of the carrier;
   wherein, when the expansion card module is connected to the connector through the electrical connection end, the expansion card module is configured to allow the second end of the carrier to be disposed on the fixing seat for enabling the latch assembly to engage with the fixing seat and the circuit board.

2. The electronic device according to claim 1, wherein the fixing seat includes a main body and a plurality of arms connected to the main body, and at least one of the arms has a hook part arranged in an end thereof, wherein the circuit board includes an upper surface, a lower surface, and a plurality of perforations that penetrate through the upper surface and the lower surface, and wherein the arms respectively correspond in position to the perforations, and the hook part of the at least one of the arms passes through at least one of the perforations so as to hook onto the lower surface of the circuit board.

3. The electronic device according to claim 1, wherein the latch assembly includes:
   a hook member; and
   a latch member slidably disposed on the hook member and being slidable relative to the hook member between a first position and a second position;
   wherein the latch assembly is engaged with the fixing seat through the hook member, and the latch assembly is latched into a thru-hole of the circuit board by moving the latch member to the second position.

4. The electronic device according to claim 3, wherein the hook member has a sliding groove and two holes that are arranged adjacent to the sliding groove, the latch member has an elastic arm, and the latch member is assembled to the sliding groove and is slidable along the hook member between the first position and the second position, and wherein, when the latch member is moved from the first position to the second position, the elastic arm engaged with one of the two holes is moved to engage with another one of the two holes.

5. The electronic device according to claim 3, wherein the fixing seat has a concave portion, and the hook member of the latch assembly is configured to engaged to the concave portion of the fixing seat.

6. The electronic device according to claim 1, wherein the expansion card module includes a pivotal shaft and an elastic member that is disposed on the pivotal shaft, the latch assembly is connected to the pivotal portion through the pivotal shaft and the elastic member, and an elastic force generated from the elastic member is provided to drive the latch assembly to engage with the fixing seat.

7. The electronic device according to claim 1, wherein the expansion card has a notch arranged away from the electrical connection end, and a limiting element is arranged in the notch of the expansion card.

8. The electronic device according to claim 1, wherein the carrier includes:
   a supporting body including the first end, the second end, and two long lateral edges that are connected to the first end and the second end, the expansion card being disposed on the supporting body; and
   a plurality of lateral sheets connected to the two long lateral edges of the supporting body;
   wherein the heat-dissipation member is fixed to the carrier through the lateral sheets, and the expansion card is sandwiched and fixed between the supporting body and the heat-dissipation member.

9. An expansion card module, comprising:
   an expansion card assembly including:
      a carrier including a first end and a second end that is opposite to the first end, the second end having a pivotal portion;
      an expansion card disposed on the carrier and having an electrical connection end that is arranged adjacent to the first end of the carrier; and
      a heat-dissipation member disposed on the expansion card, wherein the expansion card is disposed between the carrier and the heat-dissipation member; and
   a latch assembly pivotally connected to the pivotal portion of the carrier.

10. The expansion card module according to claim 9, wherein the carrier includes:
    a supporting body including the first end, the second end, and two long lateral edges that are connected to the first end and the second end, the expansion card being disposed on the supporting body; and
    a plurality of lateral sheets connected to the two long lateral edges of the supporting body;
    wherein the heat-dissipation member is fixed to the carrier through the lateral sheets, and the expansion card is sandwiched and fixed between the supporting body and the heat-dissipation member.

* * * * *

UNITED STATES PATENT AND TRADEMARK OFFICE
CERTIFICATE OF CORRECTION

PATENT NO. : 12,464,645 B2  
APPLICATION NO. : 18/406276  
DATED : November 4, 2025  
INVENTOR(S) : Ping-Mu Chen Page 1 of 1

It is certified that error appears in the above-identified patent and that said Letters Patent is hereby corrected as shown below:

On the Title Page

Insert:  
--(30)  Foreign Application Priority Data  
May 12, 2023 (TW) .................................. 112117641--

Signed and Sealed this  
Thirtieth Day of December, 2025

John A. Squires  
*Director of the United States Patent and Trademark Office*